United States Patent
Lin

(10) Patent No.: US 11,038,992 B2
(45) Date of Patent: Jun. 15, 2021

(54) BUS PACKET FORMAT DISPLAYING METHOD FOR LOGIC ANALYZER

(71) Applicant: ZEROPLUS TECHNOLOGY CO., LTD., New Taipei (TW)

(72) Inventor: Sung-Hui Lin, Taipei (TW)

(73) Assignee: ZEROPLUS TECHNOLOGY CO., LTD., New Taipei (TW)

( * ) Notice: Subject to any disclaimer, the term of this patent is extended or adjusted under 35 U.S.C. 154(b) by 302 days.

(21) Appl. No.: 16/232,751

(22) Filed: Dec. 26, 2018

(65) Prior Publication Data
US 2020/0112626 A1   Apr. 9, 2020

(30) Foreign Application Priority Data
Oct. 9, 2018   (TW) .................. 107135655

(51) Int. Cl.
| H04L 29/06 | (2006.01) |
| G06F 16/22 | (2019.01) |
| G06F 16/25 | (2019.01) |
| H04L 12/24 | (2006.01) |
| G06F 11/36 | (2006.01) |
| G01R 31/3177 | (2006.01) |
| G06F 11/25 | (2006.01) |

(52) U.S. Cl.
CPC .......... *H04L 69/22* (2013.01); *G01R 31/3177* (2013.01); *G06F 11/25* (2013.01); *G06F 11/364* (2013.01); *G06F 16/2282* (2019.01); *G06F 16/258* (2019.01); *H04L 41/22* (2013.01)

(58) Field of Classification Search
CPC .......... G01R 31/3177; G01R 31/31912; G06F 11/25; G06F 11/364; G06F 11/349; G06F 16/2282; G06F 16/258; H04L 43/50; H04L 43/18; H04L 41/22; H04L 69/22; H04L 12/40; H04L 2012/40215
See application file for complete search history.

(56) References Cited

U.S. PATENT DOCUMENTS

| 5,781,729 | A | * | 7/1998 | Baker | ............... | H04L 29/06 |
| | | | | | | 702/179 |
| 6,266,789 | B1 | * | 7/2001 | Bucher | ............... | H04L 43/18 |
| | | | | | | 707/999.006 |
| 9,178,792 | B2 | * | 11/2015 | Rule | ............... | H04L 41/22 |
| 2004/0109453 | A1 | * | 6/2004 | Wirth | ............... | H04L 41/22 |
| | | | | | | 370/393 |

(Continued)

OTHER PUBLICATIONS

Author Unknown, Capturing and Analyzing CAN frames with Wireshark, pp. 1-5, May 7, 2012 (Year: 2012).*

(Continued)

*Primary Examiner* — Christopher M Crutchfield
(74) *Attorney, Agent, or Firm* — Tracy M Heims; Apex Juris, Pllc.

(57) ABSTRACT

A bus packet format displaying method for a logic analyzer is disclosed. The logic analyzer fetches at least one packet of a bus of an electronic device. A computer host divides a plurality of bits of a second packet section of the packet into a plurality of message partitions according to a predetermined format defined in advance. Each of the message partitions has a value. The computer host gives a message name to each of the message partitions corresponding to the values and displays the message names and the values fetched by the logic analyzer on an operating screen.

8 Claims, 11 Drawing Sheets

(56) References Cited

U.S. PATENT DOCUMENTS

| | | | | |
|---|---|---|---|---|
| 2007/0083644 A1* | 4/2007 | Miller | .................... | H04L 43/18 |
| | | | | 709/224 |
| 2008/0056139 A1* | 3/2008 | Liaqat | .................... | H04L 43/00 |
| | | | | 370/242 |
| 2014/0173512 A1* | 6/2014 | Karpov | .................. | G06F 9/451 |
| | | | | 715/810 |

OTHER PUBLICATIONS

Author Unknown, CANopen, pp. 1-9, Apr. 18, 2017 (Year: 2017).*
Author Unknown, Wireshark packet-canopen dissector source code, pp. 1-35, May 6, 2017 (Year: 2017).*
Author Unkonwn, USBee AX Test Pod Users Manual, pp. 1-126, Apr. 10, 2016 (Year: 2016).*

* cited by examiner

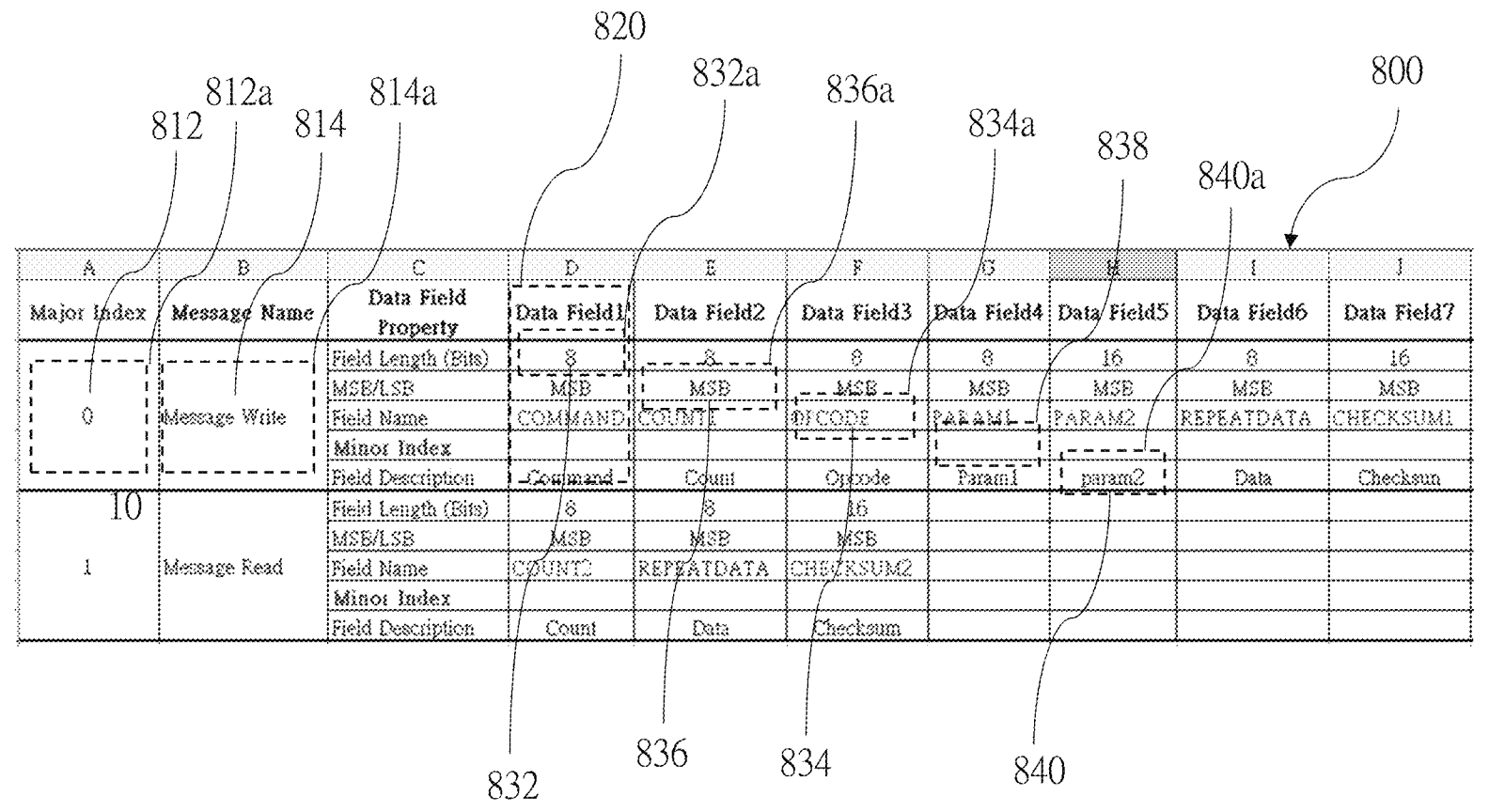

| | A | B | C | D | E | F | G | H | I | J |
|---|---|---|---|---|---|---|---|---|---|---|
| | Major Index | Message Name | Data Field Property | Data Field1 | Data Field2 | Data Field3 | Data Field4 | Data Field5 | Data Field6 | Data Field7 |
| | | | Field Length (Bits) | 8 | 8 | 8 | 8 | 16 | 0 | 16 |
| | | | MSB/LSB | MSB | MSB | MSB | MSB | MSB | MSB | MSB |
| | 0 | Message Write | Field Name | COMMAND | COUNT | OPCODE | PARAM1 | PARAM2 | REPEATDATA | CHECKSUM |
| | | | Minor Index | | | | | | | |
| | | | Field Description | Command | Count | Opcode | param1 | param2 | Data | Checksum |
| | 1 | Message Read | Field Length (Bits) | 8 | 8 | 16 | | | 0 | |
| | | | MSB/LSB | MSB | MSB | MSB | | | MSB | |
| | | | Field Name | C/INTC | REPEATDATA | CHK/NUM2 | | | REPEATDATA | |
| | | | Minor Index | | | | | | | |
| | | | Field Description | Count | Data | Checksum | | | | |

FIG. 4

| | A | B | C | D |
|---|---|---|---|---|
| | | | String Table | |
| | Field Name | Field Value | Field Display Name | Field Description |
| | COMMAND | 0x00 | Reset | Reset |
| | COMMAND | 0x01 | Sleep | Sleep |
| | COMMAND | 0x02 | Idle | Idle |
| | COMMAND | 0x03 | Command | Command |
| | OPCODE | 0X1C | DeviceKey | DeviceKey |
| | OPCODE | 0x30 | DevRev | DevRev |
| | OPCODE | 0x15 | GenDig | GenDig |
| | OPCODE | 0x11 | HMAC | HMAC |
| | OPCODE | 0x28 | CheckMac | CheckMac |
| | OPCODE | 0x17 | Lock | Lock |
| | OPCODE | 0x08 | MAC | MAC |
| | OPCODE | 0x16 | Nonce | Nonce |
| | OPCODE | 0x01 | Pause | Pause |
| | OPCODE | 0x1B | Random | Random |
| | OPCODE | 0x02 | Read | Read |
| | OPCODE | 0x47 | SHA | SHA |
| | OPCODE | 0x20 | UpdateExtra | UpdateExtra |
| | OPCODE | 0x12 | Write | Write |
| | COUNT1 | ANYVALUE | Count | Count |
| | COUNT2 | ANYVALUE | Count | Count |
| | PARAM1 | ANYVALUE | Param1 | Param1 |
| | PARAM2 | ANYVALUE | Param2 | Param2 |
| | CHECKSUM1 | ANYVALUE | Checksum | Checksum |
| | CHECKSUM2 | ANYVALUE | Checksum | Checksum |

| Major Index | Message Name | Data Field Property | Data Field1 | Data Field2 | Data Field3 | Data Field4 | Data Field5 | Data Field6 | Data Field7 |
|---|---|---|---|---|---|---|---|---|---|
| 0 | Message Write | Field Length (Bits) | 8 | 8 | 8 | 8 | 16 | 0 | 16 |
| | | MSB/LSB | MSB | MSB | MSB | MSB | MSB | MSB | MSB |
| | | Field Name | COMMAND | COUNT | OPCODE | PARAM1 | PARAM2 | REPEATDATA | CHECKSUM |
| | | Minor Index | Command | Count | Opcode | Param1 | param2 | Data | Checksum |
| 1 | Message Read | Field Length (Bits) | 8 | 8 | 16 | | | 0 | 16 |
| | | MSB/LSB | MSB | MSB | MSB | | | MSB | MSB |
| | | Field Name | C/INC | REPEATDATA | CHECKSUM2 | | | REPEATDATA | CHECKSUM |
| | | Field Description | Count | Data | Checksum | | | Data | Checksum |

FIG. 9

|  | A | B | C | D |
|---|---|---|---|---|
|  |  | String Table |  |  |
|  | Field Name | Field Value | Field Display Name | Field Description |
|  | COMMAND | 0x00 | Reset | Reset |
|  | COMMAND | 0x01 | Sleep | Sleep |
|  | COMMAND | 0x02 | Idle | Idle |
|  | COMMAND | 0x03 | Command | Command |
|  | OPCODE | 0X1C | DeviceKey | DeviceKey |
|  | OPCODE | 0x30 | DevRev | DevRev |
|  | OPCODE | 0x15 | GenDig | GenDig |
|  | OPCODE | 0x11 | HMAC | HMAC |
|  | OPCODE | 0x28 | CheckMac | CheckMac |
|  | OPCODE | 0x17 | Lock | Lock |
|  | OPCODE | 0x08 | MAC | MAC |
|  | OPCODE | 0x16 | Nonce | Nonce |
|  | OPCODE | 0x01 | Pause | Pause |
|  | OPCODE | 0x1B | Random | Random |
|  | OPCODE | 0x02 | Read | Read |
|  | OPCODE | 0x47 | SHA | SHA |
|  | OPCODE | 0x20 | UpdateExtra | UpdateExtra |
|  | OPCODE | 0x12 | Write | Write |
|  | COUNT1 | ANYVALUE | Count | Count |
|  | COUNT2 | ANYVALUE | Count | Count |
|  | PARAM1 | ANYVALUE | Param1 | Param1 |
|  | PARAM2 | ANYVALUE | Param2 | Param2 |
|  | CHECKSUM1 | ANYVALUE | Checksum | Checksum |
|  | CHECKSUM2 | ANYVALUE | Checksum | Checksum |

FIG. 11

BUS PACKET FORMAT DISPLAYING METHOD FOR LOGIC ANALYZER

BACKGROUND OF THE INVENTION

Technical Field

The present invention is related to a packet data analysis method, and more particularly to a bus packet format displaying method for a logic analyzer.

Description of Related Art

It is known that in addition to the well-defined standard specifications, there are still bus data that are not in the standard format specifications. However, bus data that are not in the standard specifications of the bus are often the focus of attention. Therefore, a conventional logic analyzer displays the bus data not in the standard specifications of the bus on an operation screen, so that the user can observe the variables of such bus data.

However, since these variables are not in the bus standard specifications, the conventional logic analyzer will not know the meaning of the variables, and therefore the meaning of each of the variables will not be correspondingly displayed on the operation screen. As a result, users cannot easily observe and analyze these variables during development and debugging. In all aspects, the conventional logic analyzer still has room for improvements.

BRIEF SUMMARY OF THE INVENTION

In view of the above, the purpose of the present invention is to provide a bus packet format displaying method for a logic analyzer, so that at least one packet of a bus could be converted from an unformatted displaying mode to a formatted displaying mode.

The present invention provides a bus packet format displaying method for a logic analyzer, wherein the logic analyzer is adapted to fetch at least one packet of a bus of an electronic device to store a file. The at least one packet in the file includes a plurality of first packet sections, which meet a specification format of a bus standard, and a second packet section, which does not meet the specification format of the bus standard. The first packet sections and the second packet section include a plurality of bits. The bus packet format displaying method comprising steps of A. define a predetermined format which corresponds to a dividing manner of the bits of the second packet section; B. fetch the at least one packet stored in the file; C. divide the bits of the second packet section of the at least one packet into a plurality of message partitions based on the predetermined format defined in step A, wherein each of the message partitions has a corresponding value; give each of the message partitions a message name; and D. display the message names and the values corresponding to the message partitions on an operating screen.

The advantage of the present invention is that the user could directly perceive the meaning and the value about the second packet section which does not meet the specification format of the bus standard, which facilitates the user to determine the correctness of the packets, enhancing an efficiency of development and debugging.

BRIEF DESCRIPTION OF THE SEVERAL VIEWS OF THE DRAWINGS

The present invention will be best understood by referring to the following detailed description of some illustrative embodiments in conjunction with the accompanying drawings, in which

FIG. 4 is a data format table according to a first embodiment of the present invention;

FIG. 5 is a string table according to the first embodiment of the present invention;

FIG. 7 is a data format table according to a second embodiment of the present invention;

FIG. 9 is a data format table according to a third embodiment of the present invention;

FIG. 11 is a string table according to the third embodiment of the present invention.

DETAILED DESCRIPTION OF THE INVENTION

Figure 1:
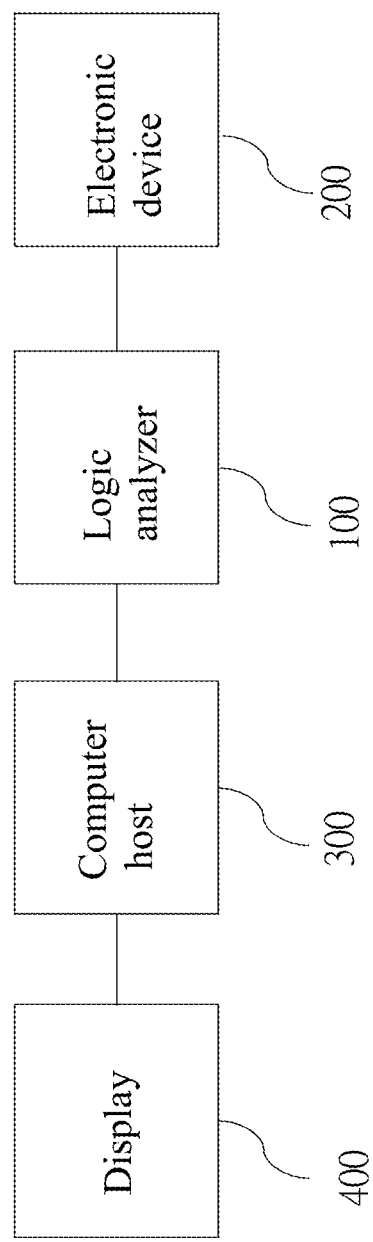
FIG. 1 is a perspective view, showing the structures of the logic analyzer of the present invention.
Figure 2:
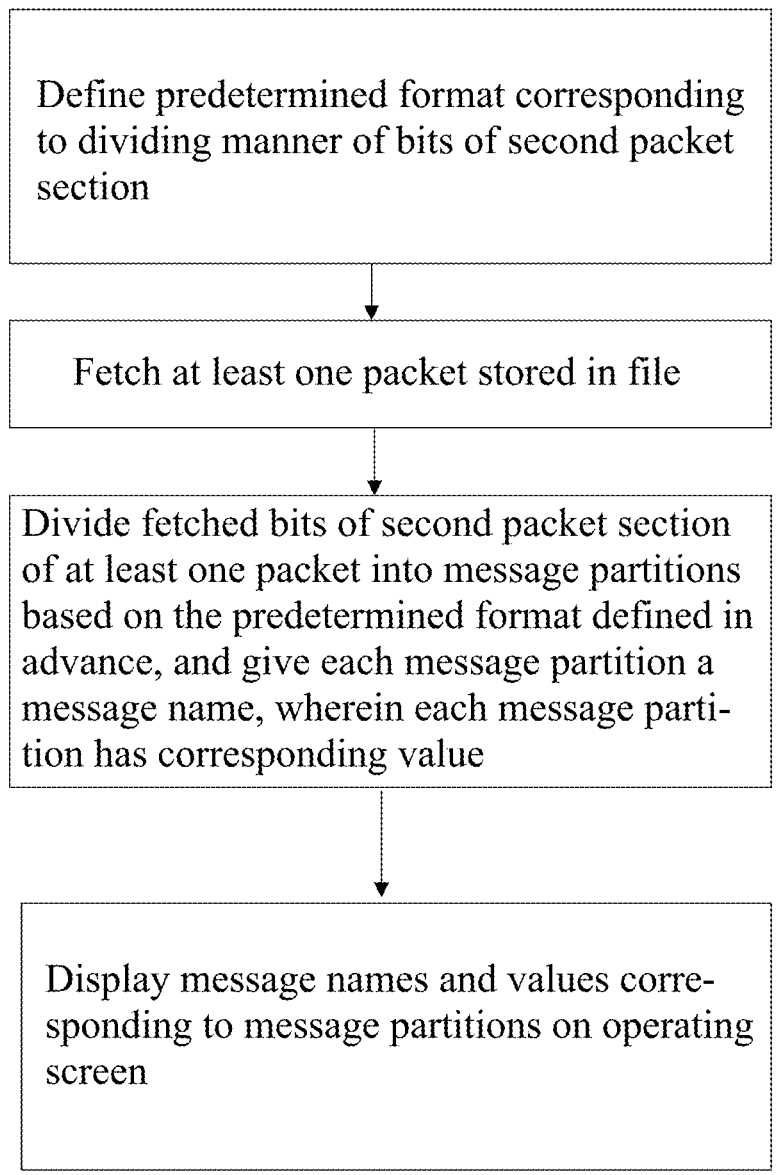
FIG. 2 is a flowchart of fetching the packet of the present invention.

FIG. 1 shows a structure of a logic analyzer 100 according to a first embodiment of the present invention and is adapted to illustrate a flowchart of a packet displaying method shown in FIG. 2.

Figure 3:
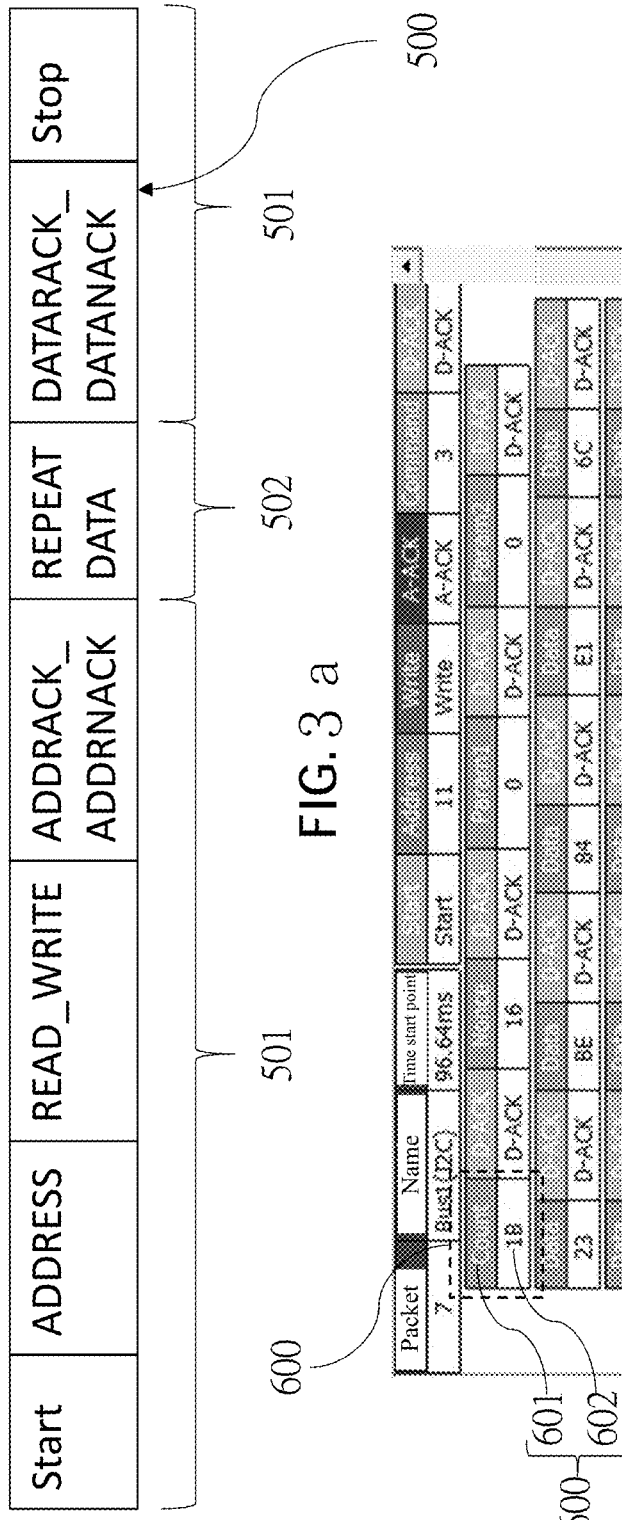
FIG. 3a is a schematic diagram, showing the packet format of the present invention.
FIG. 3b is a schematic diagram, showing the analyzed packet and the displaying format.
Figure 3:
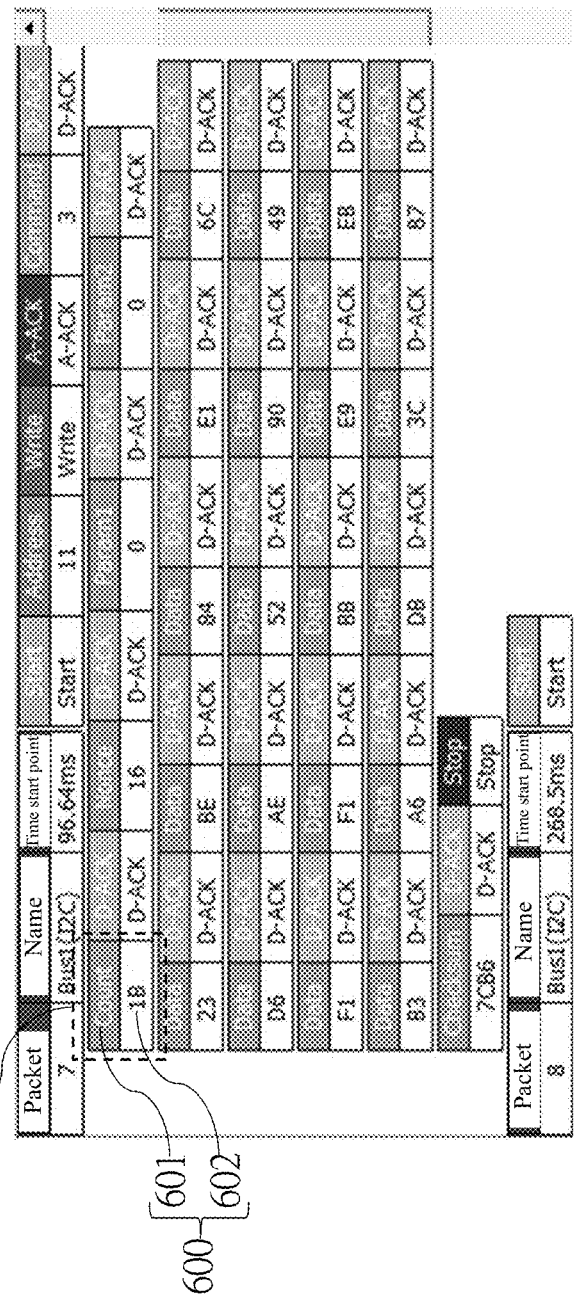

The logic analyzer 100 is electrically connected to an electronic device 200 to fetch a plurality of packets 500 of a bus of the electronic device 200 and is further electrically connected to a computer host 300 to merge the plurality of packets into a file and to store the file in the computer host 300. The computer host 300 executes a decoding program to retrieve the file and analyzes the plurality of packets according to a predetermined format defined in advance, and then an analysis result would be displayed on an operating screen through a display 400. In order to illustrate easily, one of the packets 500 shown in FIG. 3a is used for illustration. In the current embodiment, the predetermined format includes a data format table 800, a major index description table 700, and a string table 900 shown in FIG. 4 to FIG. 6.

In the current embodiment, the logic analyzer 100 receives and merges the plurality of packets 500 of the bus of the electronic device 200 into the file, and stores the file in the computer host 300. In the current embodiment, a specification of a bus standard of the bus is I2C, and the computer host 300 analyzes the packet 500 stored in the file according to the predetermined format.

FIG. 3a is a schematic diagram of a format of the packet 500. The packet 500 includes a plurality of first packet sections 501, which meet a specification format of the bus standard, and a second packet section 502, which does not meet the specification format of the bus standard, wherein the first packet section 501 and the second packet section 502 include a plurality of bits.

FIG. 3b is a schematic diagram, showing the packet 500 is analyzed. The computer host 300 divides the bits of the second packet section 502 into a plurality of message partitions 600 according to the predetermined format, wherein each of the message partitions 600 has a value 602. Each of the message partitions 600 corresponding to one of the values 602 is given a message name 601. The message names 601 and the values 602 corresponding to the message partitions 600 are displayed on the operating screen of the display 400, wherein an analyzing method would be described as follow.

Each of the message partitions 600 describes a characteristic thereof by using a major index field 812a and a plurality of data fields 820 shown in FIG. 4, and the data format table 800, the major index description table 700, and the string table 900 are stored in the computer host 300. The user could edit the three tables (i.e., the data format table 800, the major index description table 700, and the string table 900) by himself/herself, and the user could read the three tables by connecting the logic analyzer 100 and the computer host 300. However, this is not limited to the example given above. In other embodiments, the three tables could be stored in the logic analyzer 100.

As shown in FIG. 4, the data format table 800 includes the major index field 812a and a message name field 814a, wherein the major index field 812a is filled with a major index variable 812 of a major index 722, and the message name field 814a is filled with a message name string 814, and the message name string 814 corresponds to the major index variable 812 and is used as a name of the major index variable 812.

Additionally, the data format table 800 further includes the data fields 820 for describing a characteristic of the major index variable 812. Each of the data fields 820 includes a length field 832a, a name field 834a, a significant bit field 836a (MSB or LSB), and a minor index field 838a, which are adapted to be respectively filled with a section length value 832, a data-type name 834, a significant bit variable 836, and a minor index variable 838 which determine and describe a characteristic of each of the data fields 820.

Moreover, the computer host 300 divides the second packet section 502 into the message partitions 600 based on the section length values 832, wherein a unit of the section length value 832 is a bit. The data-type name 834 is adapted to determine a name of the data field 820. The significant bit variable 836 is adapted to determine an order of the data field 820. When the major index variables 812 are the same, each of the minor index variables 838 assists the computer host 300 to determine the major index variable 812 to be selected, wherein each of the message name strings 814 corresponds to one of the minor index variables 838 for being used as the name of the corresponding major index variable 812.

The data format table 800 further includes a description field 840a, wherein the description field 840a is adapted to be filled with a data type description 840 for describing a characteristic of the data-type name 834, thereby to make the characteristic of the data-type name 834 more clearly and detailed.

As shown in FIG. 5, the string table 900 includes the name field 902a, a value field 904a, and a displaying name field 906a, which are adapted to be respectively filled with the data-type name 902 for describing the characteristic of the data-type name 834, the value 904 corresponding to the data-type name 902, and the data displaying name 906 corresponding to the data-type name 902, thereby to build the characteristic of each of the data-type names 834. In addition, the string table 900 further includes a description field 908a, which is adapted to be filled with a displaying name description 908 for describing each of the data-type names 902, thereby to make the characteristic of each of the displaying name descriptions 908 more clear and detailed.

Figure 6:
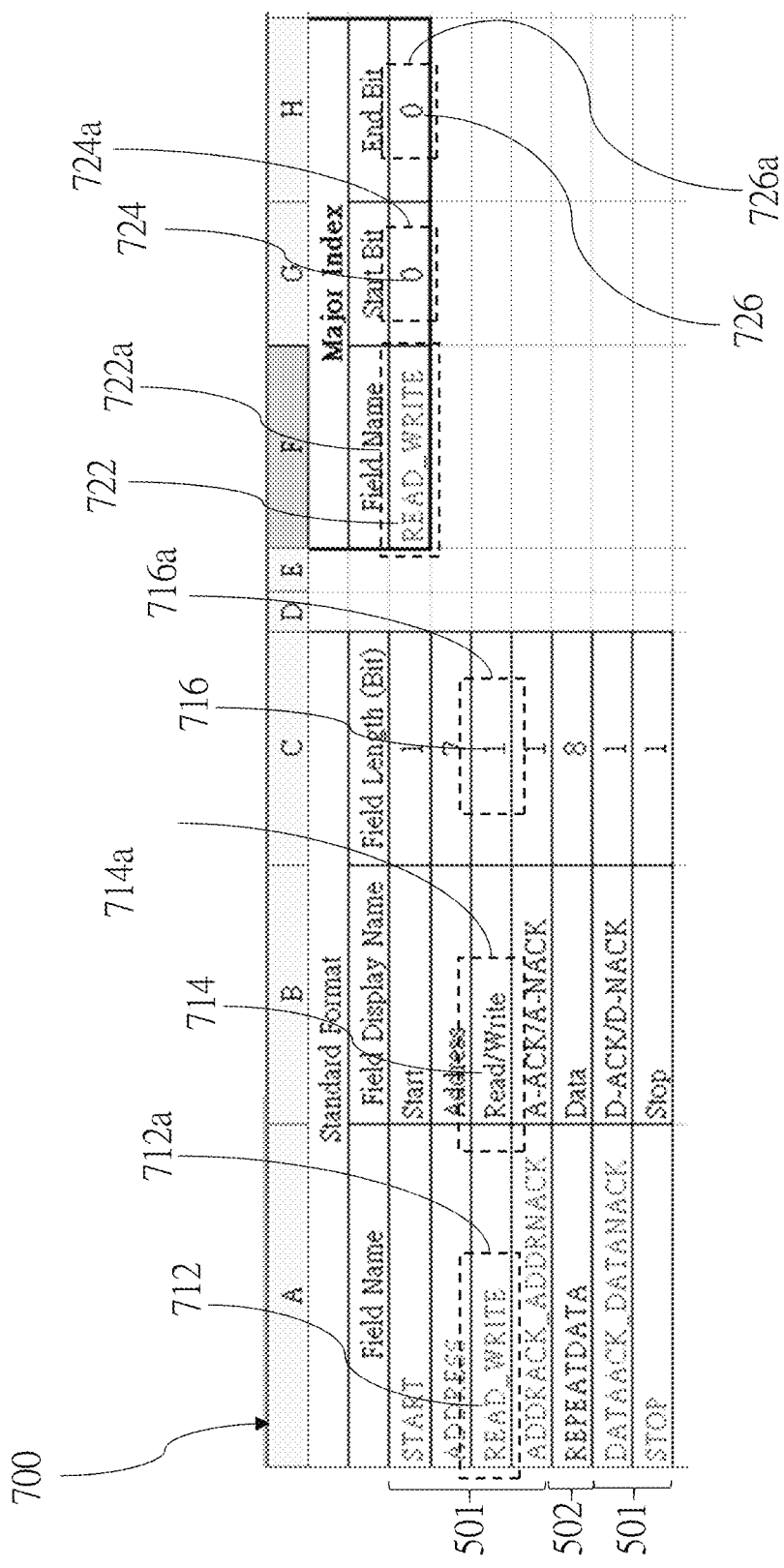
FIG. 6 is a major index description table according to the first embodiment of the present invention.

As shown in FIG. 6, the major index description table 700 includes a standard format table 701 and a major index table 702. In addition, the major index description table 700 includes a packet section name field 712a, a displaying name field 714a corresponding to the packet section name field 712a, and a length field 716a corresponding to the packet section name field 712a, which are adapted to be respectively filled with a packet section name 712, a packet section displaying name 714, and a bit length value 716 for describing a characteristic of the packet section name field 712a. The major index table 702 has a major index field 722a, a start bit field 724a, and an end bit field 726a, wherein the major index field 722a is adapted to be filled with at least one of the packet section names 712 of the first packet sections 501 as a name of the major index 722. The start bit field 724a is adapted to be filled with a start bit value 724. The end bit field 726a is adapted to be filled with an end bit value 726. The major index 722 corresponds to at least one of the packet section names 712 of the first packet sections 501. At least one of the packet section names 712 of the first packet sections 501 corresponds to at least one of the bit length values 716. The start bit value 724 and the end bit value 726 form a bit fetching range to determine a start bit fetching position and an end bit fetching position of the bit length value 716. In the current embodiment, the start bit value 724 is 0 bit, and the end bit value 726 is also 0 bit, so that a variable range of the major index variable 812 is 0 or 1.

In the first embodiment, the computer host 300 fetches a plurality of fetching bits of the first packet sections 501 within the bit fetching range based on the bit fetching range and compares the major index variables 812 of the data format table 800 to find the major index variable 812 that matches the fetching bits, and analyzes the bits of the second packet section 502 according to a characteristic of the data field 820 describing the characteristic of the major index variable 812. Then, the computer host 300 analyzes the value 602 based on the section length value 832, the significant bit variable 836, and the data-type name 834 corresponding to the major index variable 812, and based on the data displaying name 906 corresponding to the data-type name 902 and the values 904 in the string table 900, thereby to give the value 602 the corresponding data displaying name 906 as the message name 601 of the message partition 600 to be displayed on the operating screen.

In this way, the user could directly perceive a meaning and the value 602 about the second packet section 502 which does not meet the specification format of the bus standard via the operating screen of the display 400, which facilitates the user to determine the correctness of the packets 500, enhancing a work efficiency.

There is a packet format displaying method of the logic analyzer 100 according to a second embodiment, wherein in the second embodiment, a specification of a bus standard of the bus is CAN-BUS.

Figure 7:
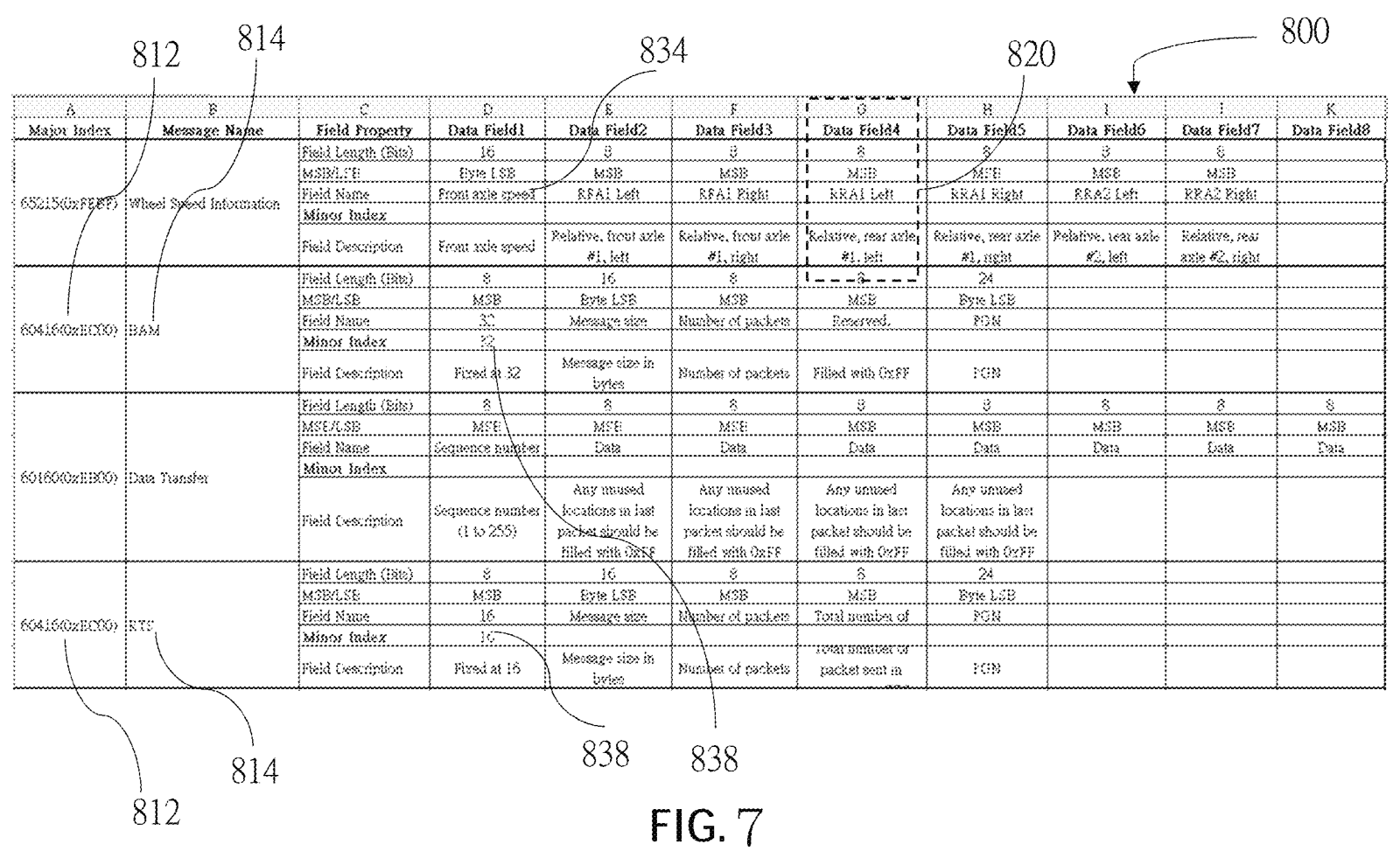

The difference between the packet format displaying method of the first embodiment and that of the second embodiment is that, as shown in FIG. 7, since the data-type name 834 of each of the data fields 820 corresponds to only one corresponding value 602, so that the data-type name 834 corresponds to only one of the data displaying names 906.

Therefore, the data-type name 834 and the corresponding value 602 do not need to be filled into the string table, just fill data format table 800 and make the string table being blank.

In the second embodiment, as shown in FIG. 7, the data format table 800 has the same two of the major index variables 812, and therefore, the two corresponding minor index variables 838 are used to assist the computer host 300 to determine the major index variable 812 to be selected, wherein the two message name strings 814 corresponds to the two minor index variables 838 for being used as the name of the two major index variables 812.

Figure 8:
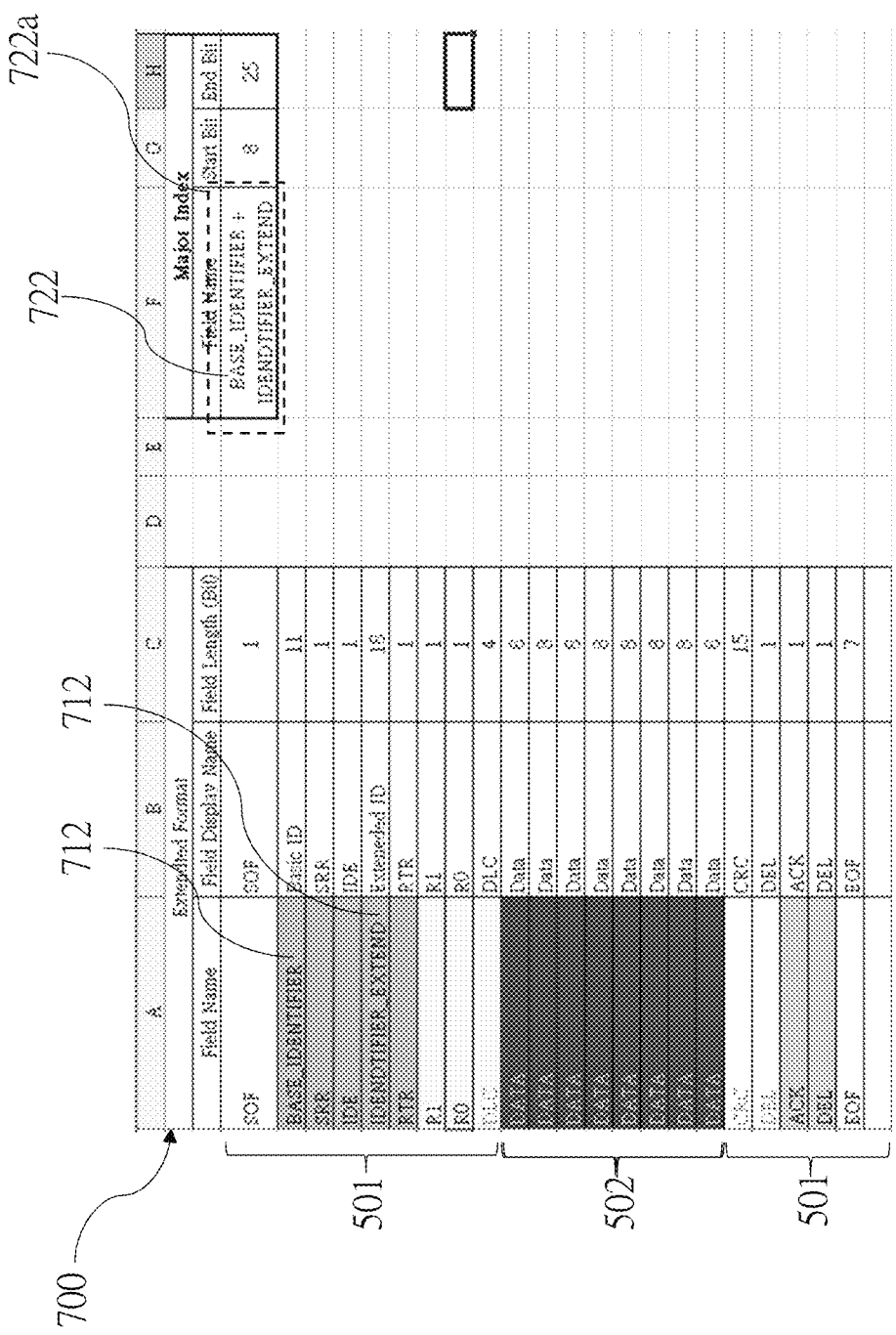
FIG. 8 is a major index description table according to the second embodiment of the present invention.

In the second embodiment, as shown in FIG. 8, a name of the major index 722 is formed by linking the two packet section names 712 of the first packet sections 501 with the "+" sign and filling in the major index field 722a.

As shown in FIG. 7 and FIG. 8, the computer host 300 fetches a plurality of fetching bits of the first packet sections 501 within the bit fetching range based on the bit fetching range and compares the major index variables 812 of the data format table 800 to find the major index variable 812 that matches the fetching bits, and analyzes the bits of the second packet section 502 according to a characteristic of the data field 820 describing the characteristic of the major index variable 812. Then, the computer host 300 analyzes the value 602 based on the section length value 832, the significant bit variable 836, and the data-type name 834 corresponding to the major index variable 812, and there is no need to compare the string table 900, thereby to give the value 602 the corresponding data-type name 834 as the message name 601 of the message partition 600 to be displayed on the operating screen.

There is a packet format displaying method of the logic analyzer 100 according to a third embodiment, wherein in the third embodiment, a specification of a bus standard of the bus is also CAN-BUS. The difference between the packet format displaying method of the third embodiment and that of the second embodiment is that, in the third embodiment, the data-type name 834 of each of the data fields 820 corresponds to the value 904 corresponding to the data-type name 902, and each of the values 904 corresponds to only one of the data displaying names 906, so that the data-type name 902, the values 904 corresponding to the data-type name 902, and the data displaying name 906 corresponding to each of the values 904 should be filled into the string table. In this way, the computer host 300 fetches a plurality of fetching bits of the first packet sections 501 within the bit fetching range based on the bit fetching range and compares the major index variables 812 of the data format table 800 to find the major index variable 812 that matches the fetching bits, and analyzes the bits of the second packet section 502 according to a characteristic of the data field 820 describing the characteristic of the major index variable 812. Then, the computer host 300 analyzes the value 602 based on the section length value 832, the significant bit variable 836, the minor index variable 838, and the data-type name 834 corresponding to the major index variable 812, and based on the data displaying name 906 corresponding to the data-type name 902 and the values 904 in the string table 900, thereby to give the value 602 the corresponding data displaying name 906 as the message name 601 of the message partition 600.

Figure 10:
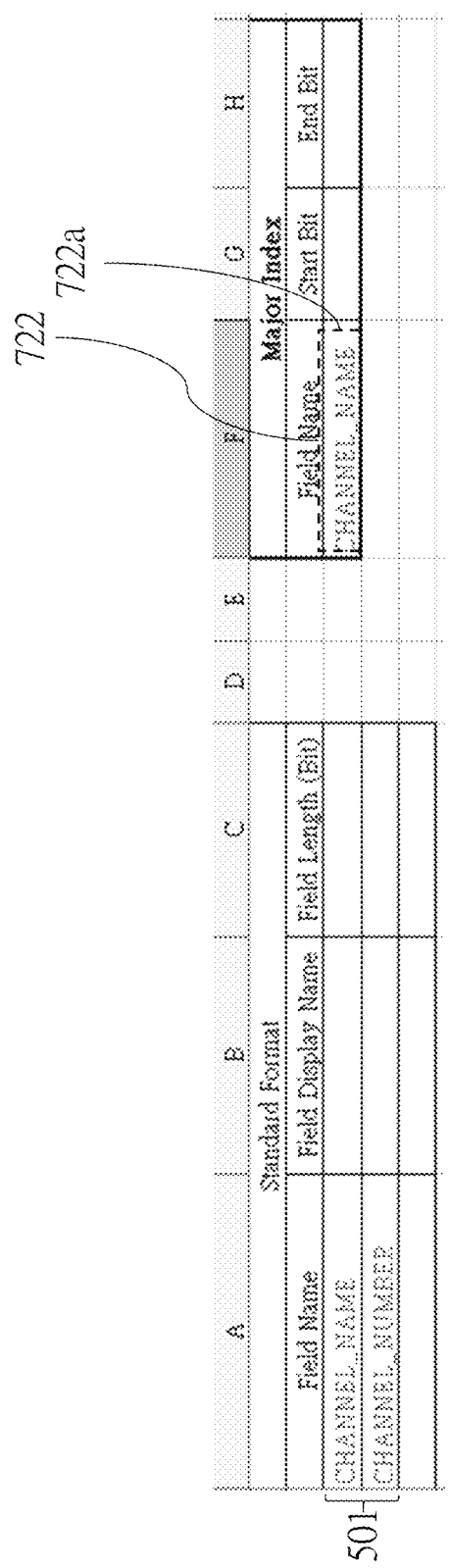
FIG. 10 is a major index description table according to the third embodiment of the present invention.

There is a packet format displaying method of the logic analyzer 100 according to a fourth embodiment, wherein in the fourth embodiment, a specification of a bus standard of the bus is SPI. The difference between the packet format displaying method of the fourth embodiment and that of the first embodiment is that, the major index variables 812 of the major index 722 are determined according to a plurality of channel names of the logic analyzer 100 that could be inputted by the user. As shown in FIG. 9 to FIG. 11 different from FIG. 4 of the first embodiment, the major index variables 812 in FIG. 4 are values, while the major index variables 812 in FIG. 9 are strings, wherein the strings could be numbers, letters, or a combination of the two. More specifically, the strings in FIG. 9 are number strings, wherein a number string "0" stands for "Channel 0", and a number string "1" stands for "Channel 1". In practice, the major index variables 812 in FIG. 9 could be letter strings, for example, a letter string "MOSI" and a letter string "MISO". In this way, when the major index field 722a is filled with "Channel Name" as the major index 722, the computer host 300 fetches a plurality of fetching bits of the first packet sections 501 within the bit fetching range based on the major index 722 and compares the major index variables 812 of the data format table 800 to find the major index variable 812 that matches the fetching bits of the first packet sections 501, and analyzes the bits of the second packet section 502 according to a characteristic of the data field 820 describing the characteristic of the major index variable 812. Then, the computer host 300 analyzes the value 602 based on the section length value 832, the significant bit variable 836, and the data-type name 834 corresponding to the major index variable 812, and based on the data displaying name 906 corresponding to the data-type name 902 and the values 904 in the string table 900, thereby to give the value 602 the corresponding data displaying name 906 as the message name 601 of the message partition 600 to be displayed on the operating screen.

With the aforementioned design, the logic analyzer 100 could fetch the packets 500 of the bus of the electronic device 200. The computer host 300 divides the second packet section 502 into the values 602 of the message partitions 600 based on the section length value 832 according to a setting of the data format table 800, the major index description table 700, and the string table 900 of the predetermined format, thereby to give the value 602 the corresponding data-type name 834 or the corresponding data displaying name 906 as the message name 601 of the message partition 600, so that the at least one packet 500 of the bus could be converted from an unformatted displaying mode to a formatted displaying mode. In this way, the user could directly perceive the meaning and the value 602 about the second packet section 502 which does not meet the specification format of the bus standard, facilitating the user to determine the correctness of the packets 500 and enhancing a work efficiency. In practice, the logic analyzer 100 could fetch the at least one packet 500 of the bus of the electronic device 200, and store it into the file, so that the computer host 300 could execute the aforementioned packet format displaying method.

It must be pointed out that the embodiments described above are only some embodiments of the present invention. All equivalent methods which employ the concepts disclosed in this specification and the appended claims should fall within the scope of the present invention.

What is claimed is:

1. A bus packet format displaying method for a logic analyzer, wherein the logic analyzer is adapted to fetch at least one packet of a bus of an electronic device to store a file; the at least one packet in the file includes a plurality of first packet sections, which meet a specification format of a bus standard, and a second packet section, which does not meet the specification format of the bus standard; the first packet sections and the second packet section include a plurality of bits; the bus packet format displaying method comprising steps of:

A. defining a predetermined format which corresponds to a dividing manner of the bits of the second packet section, wherein the predetermined format comprises a section length value corresponds to each of the message partitions; a major index field and a plurality of data fields are used to describe a characteristic of each of the message partitions; the predetermined format further comprises a data format table; the data format table comprises the major index field; a major index variable of a major index is filled into the major index field; the data format table further comprises the data fields for describing the characteristic of each of the message partitions; each of the data fields comprises a length field which is adapted to be filled with one of the section length values for determining a data length of each of the data fields and a name field which is adapted to be filled with a data-type name for determining a data type of each of the data fields;

B. fetching the at least one packet stored in the file;

C. dividing the bits of the second packet section of the at least one packet into a plurality of message partitions based on each of the section length values of the predetermined format defined in step A, wherein each of the message partitions has a corresponding value; giving each of the message partitions a message name; and D. displaying the message names and the values corresponding to the message partitions on an operating screen.

2. The method of claim 1, wherein in step A, the predetermined format further comprises a major index description table; the major index description table comprises a standard format table and a major index table; the standard format table determines a plurality of bit length values corresponding to the bits of the first packet section and the second packet section of the at least one packet by a length field filled with the bit length values, and determines a plurality of packet section names and a plurality of packet section displaying names by a packet section name field and a displaying name field; the major index table comprises a major index field which is adapted to be filled with at least one of the packet section names of the first packet section as a name of the major index.

3. The method of claim 2, wherein in step A, the major index table has a start bit field adapted to be filled with a start bit value and an end bit field adapted to be filled with an end bit value, and corresponds to at least one of the packet section names of the first packet sections; at least one of the packet section names of the first packet sections corresponds to at least one of the bit length values; the start bit value and the end bit value form a bit fetching range to determine a start bit fetching position and an end bit fetching position of the corresponding bit length value.

4. The method of claim 3, wherein in step C, the fetching bits of the first packet sections within the bit fetching range are fetched, and the major index variables of the data format table are compared to find one of the major index variables that matches the fetching bits, and the bits of the second packet section are analyzed according to a characteristic of the data fields describing the characteristic of the corresponding major index variable, and the corresponding value is analyzed based on one of the section length values and one of the data-type names corresponding to the corresponding major index variable, thereby to give the corresponding value the corresponding data-type name as the corresponding message name of the corresponding message partition.

5. The method of claim 3, wherein in step A, the predetermined format further comprises a string table; the string table comprises the name fields, a value field, and a displaying name field, which are adapted to be respectively filled with the data-type names for describing the characteristic of each of the data-type names, each of the values corresponding to one of the data-type names, and a data displaying name corresponding to each of the data-type names; in step C, the following further steps are done, fetching the fetching bits of the first packet sections within the bit fetching range, and comparing the major index variables of the data format table to find one of the major index variables that matches the fetching bits, and analyzing the bits of the second packet section according to a characteristic of the data fields describing the characteristic of the corresponding major index variable, and analyzing the corresponding value based on one of the section length values and one of the data-type names corresponding to the corresponding major index variable and based on one of the data displaying names corresponding to the corresponding data-type name and the corresponding value in the string table, thereby to give the corresponding value the corresponding data displaying name as the corresponding message name of the corresponding message partition.

6. The method of claim 3, wherein in step A, each of the data fields further comprises a significant bit field (MSB/LSB) and a minor index field, which are adapted to be respectively filled with the significant bit variable and a minor index variable for describing the characteristic of each of the data fields; in step C, the following further steps are done, fetching the fetching bits of the first packet sections within the bit fetching range, and comparing the major index variables of the data format table to find one of the major index variables that matches the fetching bits, and analyzing the bits of the second packet section according to a characteristic of the data fields describing the characteristic of the corresponding major index variable, and analyzing the corresponding value based on the corresponding section length value, the corresponding data-type name, the corresponding significant bit variable, and the corresponding minor index variable corresponding to the corresponding major index variable, thereby to give the corresponding value the corresponding data-type name as the corresponding message name of the corresponding message partition.

7. The method of claim 3, wherein in step A, each of the data fields further comprises a significant bit field (MSB/LSB) and a minor index field, which are adapted to be respectively filled with the significant bit variable and a minor index variable for describing the characteristic of each of the data fields; the predetermined format further comprises a string table, wherein the string table comprises the name fields, a value field, and a displaying name field, which are adapted to be respectively filled with the data-type names for describing the characteristic of each of the data-type names, each of the values corresponding to one of the data-type names, and a data displaying name corresponding to each of the data-type names; in step C, the following further steps are done, fetching the fetching bits of the first packet sections within the bit fetching range, and comparing the major index variables of the data format table to find one of the major index variables that matches the fetching bits, and analyzing the bits of the second packet section according to a characteristic of the data fields describing the characteristic of the corresponding major index variable, and analyzing the corresponding value based on the corresponding section length value, the corresponding significant bit variable, the corresponding minor index variable, and the corresponding data-type name corresponding to the corresponding major index variable, and based on one of the data displaying names corresponding to the data-type name and the corresponding value in the string table, thereby to give the corresponding value the corresponding data displaying name as the corresponding message name of the corresponding message partition.

8. The method of claim 1, wherein in step A, the data format table further comprises a message name field filled with a message name string; the message name string corresponds to each of the major index variables and is used as a name of the corresponding major index variable.

* * * * *